(12) United States Patent
Hughes et al.

(10) Patent No.: US 11,251,323 B2
(45) Date of Patent: Feb. 15, 2022

(54) SOLAR POWER HARVESTING BUILDING ENVELOPE

(71) Applicant: Rensselaer Polytechnic Institute, Troy, NY (US)

(72) Inventors: Michael Hughes, Troy, NY (US); Diana-Andra Borca-Tasciuc, Troy, NY (US); Deborah A. Kaminski, Schenectady, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 150 days.

(21) Appl. No.: 16/317,642

(22) PCT Filed: Jul. 12, 2017

(86) PCT No.: PCT/US2017/041614
§ 371 (c)(1),
(2) Date: Jan. 14, 2019

(87) PCT Pub. No.: WO2018/013621
PCT Pub. Date: Jan. 18, 2018

(65) Prior Publication Data
US 2019/0245105 A1    Aug. 8, 2019

Related U.S. Application Data

(60) Provisional application No. 62/361,023, filed on Jul. 12, 2016.

(51) Int. Cl.
*H02S 20/26* (2014.01)
*H02S 30/10* (2014.01)
(Continued)

(52) U.S. Cl.
CPC ............ *H01L 31/0547* (2014.12); *G02B 5/04* (2013.01); *G02B 5/08* (2013.01); *G02B 6/005* (2013.01);
(Continued)

(58) Field of Classification Search
CPC .......... H02S 40/22; H02S 30/10; H02S 20/26; H01L 31/0543; H01L 31/0547; H01L 31/054; H01L 31/055
See application file for complete search history.

(56) References Cited

U.S. PATENT DOCUMENTS 4,164,432 A    8/1979    Boling
4,188,239 A    2/1980    Boling
(Continued)

FOREIGN PATENT DOCUMENTS

WO    2013008186 A2    1/2013

OTHER PUBLICATIONS

International Search Report and the Written Opinion of the International Searching Authority, International Application No. PCT/US2017/041614, dated Sep. 22, 2017.
(Continued)

*Primary Examiner* — Bethany L Martin
(74) *Attorney, Agent, or Firm* — ,Murtha Cullina LLP; Anthony P. Gangemi

(57) ABSTRACT

A system for providing a solar harvesting building envelope is disclosed. The system includes a plurality of solar harvesting apparatus configured to be installed as or on a building envelope in manner like that of traditional shingles or siding. The apparatus includes a frame having a photovoltaic end wall, as well as reflective base and side walls. A translucent, wedge-shaped body layer is positioned on the frame. A luminescent species film is positioned at and substantially parallel to a base of the wedge-shaped body
(Continued)

layer, such that the luminescent species film is positioned at an angle relative to the photovoltaic end wall. Light incident on the wedge-shaped body layer is concentrated towards the photovoltaic end wall, such as through absorption and re-emission along with scattering by the luminescent species film and internal reflection by the wedge-shaped body layer and the reflective base and side walls of the frame. A plurality of apparatus may be wired together to create the building envelope, which has the added advantage of substantially eliminating shading losses of traditional solar harvesting systems.

12 Claims, 4 Drawing Sheets

(51) Int. Cl.
| | |
|---|---|
| H01L 31/054 | (2014.01) |
| H01L 31/055 | (2014.01) |
| F21V 8/00 | (2006.01) |
| G02B 5/08 | (2006.01) |
| G02B 6/43 | (2006.01) |
| G02B 19/00 | (2006.01) |
| G02B 5/04 | (2006.01) |
| H01L 31/048 | (2014.01) |

(52) U.S. Cl.
CPC .......... *G02B 6/43* (2013.01); *G02B 19/0019* (2013.01); *G02B 19/0042* (2013.01); *H01L 31/048* (2013.01); *H01L 31/055* (2013.01); *H02S 20/26* (2014.12); *H02S 30/10* (2014.12); *G02B 6/0046* (2013.01); *Y02E 10/52* (2013.01)

(56) References Cited

U.S. PATENT DOCUMENTS

| | | | |
|---|---|---|---|
| 4,199,376 | A | 4/1980 | Sill |
| 4,344,417 | A | 8/1982 | Malecek |
| 4,661,649 | A | 4/1987 | Reisfeld et al. |
| 5,538,563 | A | 7/1996 | Finkl |
| 2006/0107993 | A1 | 5/2006 | Wilhelm Krokoszinski et al. |
| 2007/0227582 | A1* | 10/2007 | Chen .................. G02B 19/0042 136/246 |
| 2008/0223438 | A1* | 9/2008 | Xiang .................. H01L 31/055 136/257 |
| 2010/0165495 | A1 | 7/2010 | Murtha |
| 2011/0120527 | A1 | 5/2011 | Huang et al. |
| 2011/0192447 | A1 | 8/2011 | Shteyman |
| 2011/0259421 | A1* | 10/2011 | Chung .................... F24S 23/77 136/259 |
| 2012/0240979 | A1* | 9/2012 | Maeda ................ H01L 31/0547 136/247 |
| 2014/0196785 | A1* | 7/2014 | Lin ........................ F24S 23/79 136/259 |
| 2016/0329448 | A1* | 11/2016 | Chou ................ H01L 31/02327 |

OTHER PUBLICATIONS

Maruyama, T., et al., "Wedge-shaped light concentrator using total internal reflection," Solar Energy Materials and Solar Cells, vol. 57, Issue 1, p. 75-83, Feb. 1999 (Abstract).

Hughes, M.D., et al., "Performance comparison of wedge-shaped and planar luminescent solar concentrators," Renewable Energy 52, p. 266-272, 2013.

Desmet, L., et al., "Monocrystalline silicon photovoltaic luminescent solar concentrator with 4.2% power conversion efficiency," Optical Society of America, 2012.

* cited by examiner

SOLAR POWER HARVESTING BUILDING ENVELOPE

CROSS REFERENCE TO RELATED APPLICATIONS

This application claims the benefit of U.S. Provisional Application No. 62/361,023, filed Jul. 12, 2016, which is incorporated by reference as if disclosed herein in its entirety.

BACKGROUND

Photovoltaics (PV) are envisioned to be part of net-zero energy building design. However, this may remain an elusive goal unless economically and environmentally sensible solutions are found to allow for the widespread use of this technology. The modest ratio of performance (efficiency of energy conversion) to system cost remains the main obstacle to the widespread use of PV cells. One way to reduce cost is by using concentrators to collect sunlight from large surface areas and concentrate it onto small areas of PV cells. Some exemplary concentration systems include reflective, refractive, and luminescent concentrators.

Luminescent solar concentrators typically consist of a plastic sheet doped with luminescent materials. The light incident on the concentrator's surface is partially absorbed and re-emitted by the luminescent species at longer wavelengths. The luminescent emission and remaining incident light is concentrated onto an edge where a photovoltaic cell is placed.

Luminescent solar concentrators have key advantages over refractive or reflective concentrators. They accept direct and indirect daylight and thus may eliminate the use of solar tracking systems. Further, they may be spectrally coupled to solar cells by matching the emission peak to the peak in the solar cell's spectral response, which results in enhanced conversion efficiencies (more efficient conversion of light to electricity).

Effectively utilizing phosphors in luminescent solar concentrators is challenging because they are highly light scattering, which may increase both non-emissive absorption and escape cone losses. For this reason, there have been very few investigations into the performance of luminescent solar concentrators utilizing phosphors.

SUMMARY

Some embodiments of the disclosed subject matter are directed to a solar harvesting apparatus. In some embodiments, the apparatus includes a frame including a base, side walls, and a photovoltaic end wall. In some embodiments, the frame base and side walls are reflective. A wedge-shaped body layer is positioned on and/or in the frame. In some embodiments, the body layer is translucent.

A luminescent species film is positioned at or near the base of the body layer. In some embodiments, the luminescent species film is substantially parallel to the base of the body layer. In some embodiments, the luminescent species film is positioned at an angle to the photovoltaic end wall. Light incident on the body layer is transmitted to the luminescent species film, where it is absorbed and re-emitted and/or scattered. The emitted and scattered light and other refracted light are concentrated towards and eventually absorbed by the photovoltaic end wall.

In some embodiments, a plurality of apparatus are installed as a building envelope, such as in place of, or in addition to, traditional shingles and siding. In some embodiments, the plurality of apparatus are wired together to maximize power output.

BRIEF DESCRIPTION OF THE DRAWINGS

The drawings show embodiments of the disclosed subject matter for the purpose of illustrating the invention. However, it should be understood that the present application is not limited to the precise arrangements and instrumentalities shown in the drawings, wherein.

DETAILED DESCRIPTION

Figure 1A:
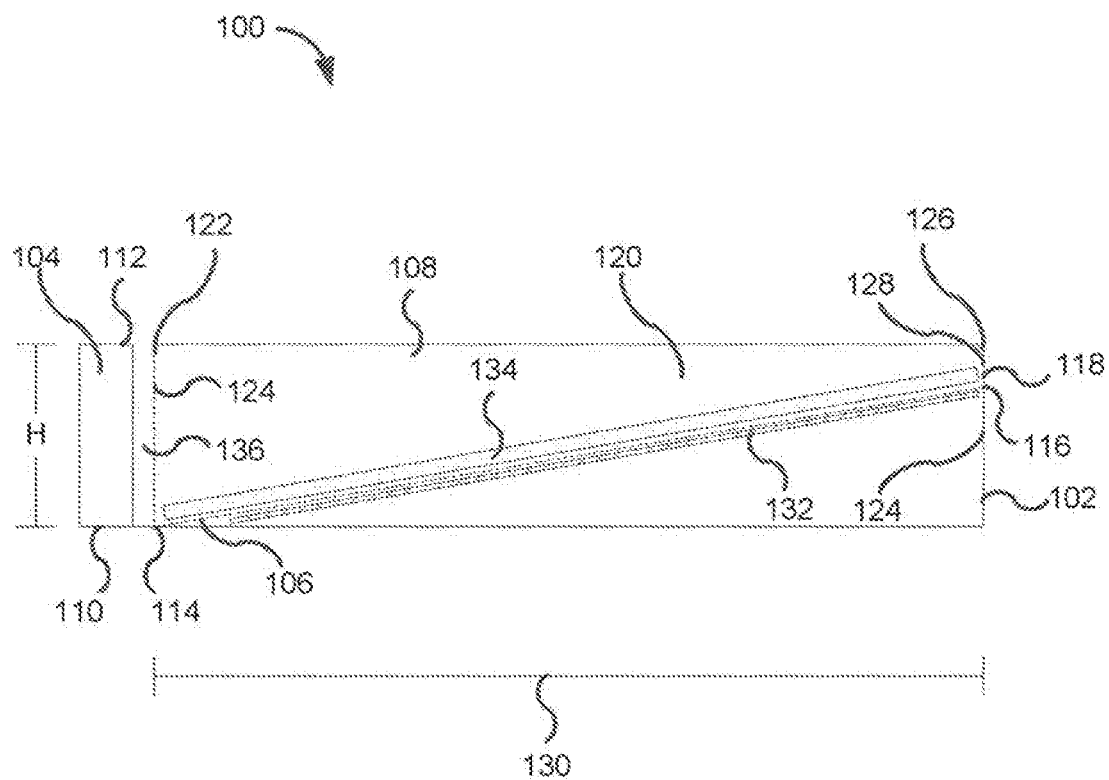
FIG. 1A is a schematic drawing of a solar power harvesting apparatus according to some embodiments of the present disclosure.
Figure 1B:
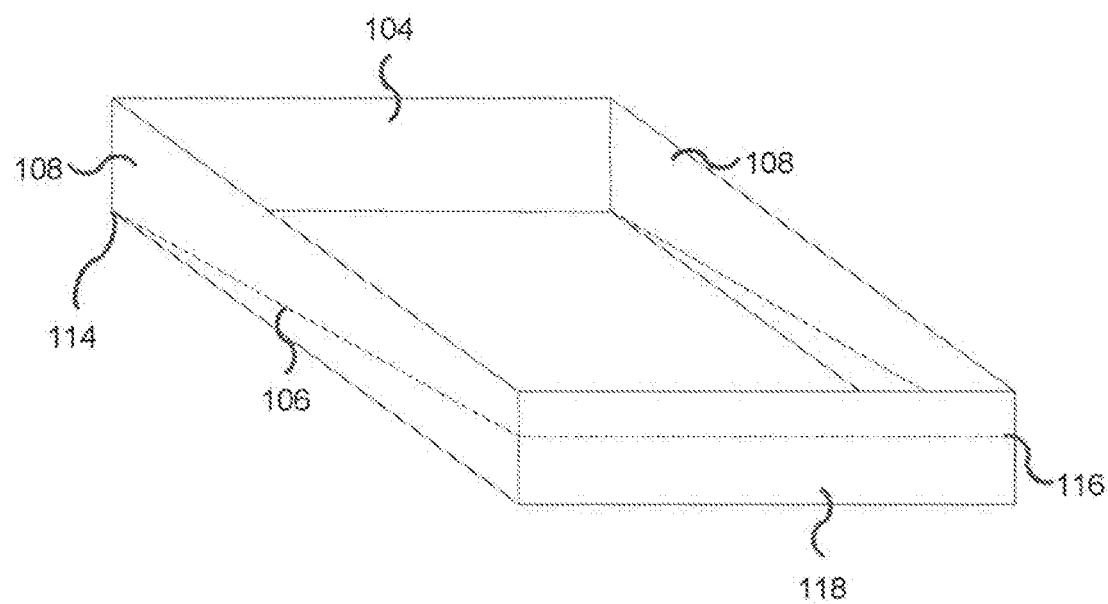
FIG. 1B is a schematic isometric drawing of a solar power harvesting apparatus according to some embodiments of the present disclosure.

Referring now to FIG. 1A, aspects of the disclosed subject matter include a solar power harvesting apparatus 100 including a frame 102. In some embodiments, frame 102 includes an end wall 104, base 106, and a side wall 108. In some embodiments, frame 102 is composed of metal, e.g., aluminum, plastic, e.g., vinyl, foam, wood, ceramic, or a combination thereof. End wall 104 is composed of a photovoltaic material. In some embodiments, end wall 104 is a photovoltaic device. End wall 104 includes a bottom 110 and a top 112 and has a wall height (H) defined between the bottom and the top. In some embodiments, end wall 104 is composed of polycrystalline silicon, monocrystalline silicon, GaAs, CdTe, CIGS, perovskite, or a combination thereof. Base 106 has a first end 114 and a second end 116. In some embodiments, base 106 is positioned at an angle to end wall 104 with first end 114 adjacent bottom 110 of the end wall. In some embodiments, the angle between base 106 and end wall 104 is acute. In some embodiments, the angle between base 106 and end wall 104 is a substantially right angle. In some embodiments, base 106 is reflective. Now referring to FIG. 1B, in some embodiments, frame 102 includes opposing side walls 108. In some embodiments, side wall 108 is reflective. In some embodiments, frame 102 includes an end wall 118 opposing end wall 104. In some embodiments, end wall 118 is reflective.

Referring again to FIG. 1A, apparatus 100 includes a translucent body layer 120. In some embodiments, translucent body layer 120 is positioned on frame 102. In some embodiments, translucent body layer 120 is directly attached to end wall 104. In some embodiments, end wall 104 is attached to translucent body layer 120 but not to frame 102. In some embodiments, translucent body layer 120 is positioned on base 106. In some embodiments, translucent body layer 120 is in contact with side walls 108. In some embodiments, base 106 and/or side walls 108 are reflective where those components contact translucent body layer 120. In some embodiments, translucent body layer 120 is composed of a polymer. In some embodiments, translucent body layer 120 is composed of silicone, vinyl, other translucent plastics, other translucent materials, e.g., glass, hydrogels, etc., or a combination thereof. In some embodiments, translucent body layer 120 is hollow. In some embodiments, translucent body layer 120 includes a first body layer end 122 having a first end height 124 at end wall 104 and a second body layer end 126 having a second end height 128 opposing first body layer end 122. In some embodiments, translucent body layer 120 is wedge-shaped. In some embodiments, second end height 128 is smaller than first end height 124. In some embodiments, translucent body layer 120 has a length 130. In some embodiments, length 130 extends along the entire frame 102. In some embodiments, length 130 extends along less than the entire frame 102. In some embodiments, an aspect ratio of length 130 to first end height 124 is about 1 or greater. In some embodiments, an aspect ratio of length 130 to first end height 124 is greater than about 4. In some embodiments, an aspect ratio of length 130 to first end height 124 is greater than about 7. In some embodiments, a reflective film 132 is positioned between translucent body layer 120 and base 106. In some embodiments, a gap is positioned between translucent body layer 120 and reflective film 132. This gap is created to reduce imperfect reflection from reflective film 132.

Figure 2:
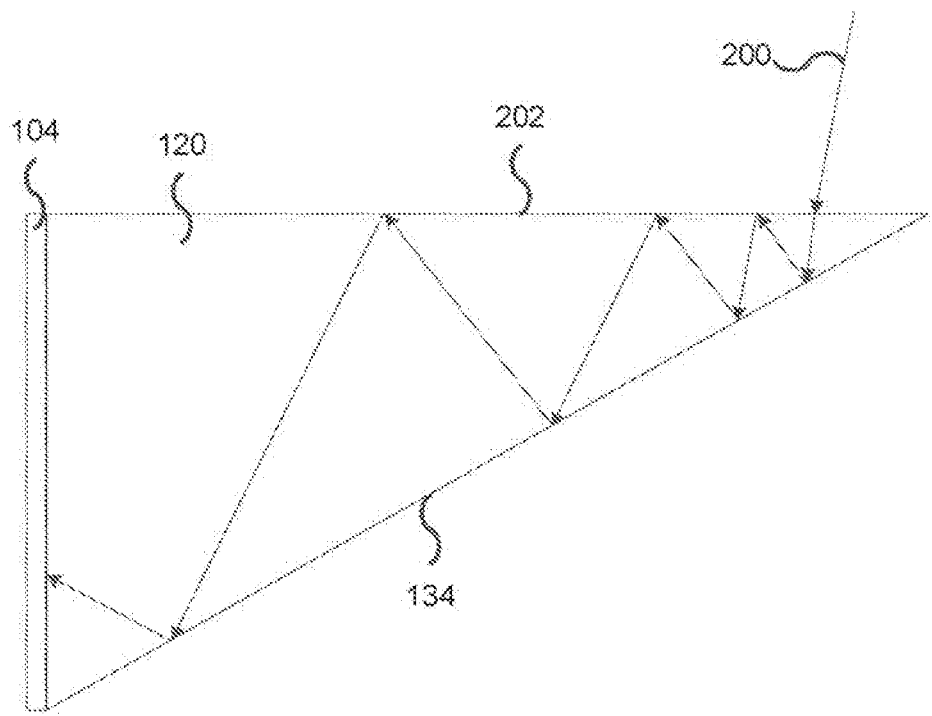
FIG. 2 is a schematic drawing of a solar power harvesting apparatus according to some embodiments of the present disclosure.

In some embodiments, a film 134 is positioned in translucent body layer 120. In some embodiments, film 134 is positioned between translucent body layer 120 and base 106. In some embodiments, film 134 extends along the entire length 130. In some embodiments, film 134 extends along less than the entire length 130. In some embodiments, the film 134 is composed of fluorescent dye, quantum dots, phosphor, or a combination thereof. In some embodiments, film 134 has a luminescent species concentration higher than 0 mg/ml. In some embodiments, film 134 has a luminescent species concentration of about 20 mg/ml to about 40 mg/ml. In some embodiments, film 134 has a concentration of about 25 mg/ml to about 30 mg/ml. In some embodiments, film 134 is positioned at a height above base 106 or reflective film 132 less than H/2. In some embodiments, film 134 is positioned at a height above base 106 or reflective film 132 less than 10 mm. In some embodiments, base 106 and film 134 are substantially parallel, defining substantially parallel planes. In some embodiments, base 106 and film 134 are non-parallel. In some embodiments, a film 134 is positioned at the base of translucent body layer 120. In some embodiments, base 106 is positioned directly underneath film 134. In some embodiments, film 134 is embedded in translucent body layer 120. Referring now to FIG. 2, the functionality of apparatus 100 is pictographically portrayed. Light from a source 200, i.e., direct daylight, diffuse light, artificial lighting, etc., falls on translucent body layer 120. The light is refracted into the translucent body layer when it strikes the body layer surface 202. The light then continues to film 134, where it is absorbed and/or scattered. The absorbed light is then emitted by film 134. At least in part because of the wedge shape of translucent body 120, the emitted light is concentrated in a direction towards that end wall Light is contained through reflection via the frame 102 and/or base 106, side wall 108, end wall 118, via reflective film 132, internal reflection by body layer surface 202, and/or via repeated absorption/emission and scattering by film 134. This successive reflection may increase total internal reflection, concentrating the light and focusing it towards end wall 104 for absorption and power generation.

Referring again to FIG. 1, in some embodiments, a gap 136 is positioned between end wall 104 and first body layer end 122. Gap 136 close to end wall 104 may be left as is or may be filled with an optical transparent material with index of refraction between that of surface material of end wall 104 and translucent body 120, in order to minimize reflections at the end wall/transparent body interface.

In some embodiments, a plurality of apparatus 100 are positioned on a building envelope, e.g., as a solar power harvesting system for that building. In these embodiments, the plurality of apparatus 100 act as modular construction materials positioned on the building envelope or acting themselves as the building envelope. Films 134 from the plurality of apparatus 100 receive light incident on translucent body layer 120 and help concentrate the incident light towards the plurality of end walls 104 for absorption and power generation. In some embodiments, the plurality of apparatus 100 are wired to maximize the power output. In some embodiments, the plurality of apparatus 100 are wired in parallel. In some embodiments, the plurality of apparatus 100 are wired in series. In some embodiments, the plurality of apparatus 100 are wired in a combination of parallel and series.

Apparatus consistent with the present disclosure offer myriad advantages over previous systems. The concentration of luminescent species as a film, placement of that film at a base of a translucent body layer, and the use of a wedge-shaped body layer increases overall percentage of light absorbed by the photovoltaic material end wall, which results in increased power per unit area in the apparatus. Further, the ability of the apparatus of the present disclosure to internally reflect and concentrate light towards the photovoltaic end wall means less reliance on direct or specific incidence angles for light.

Figure 3:
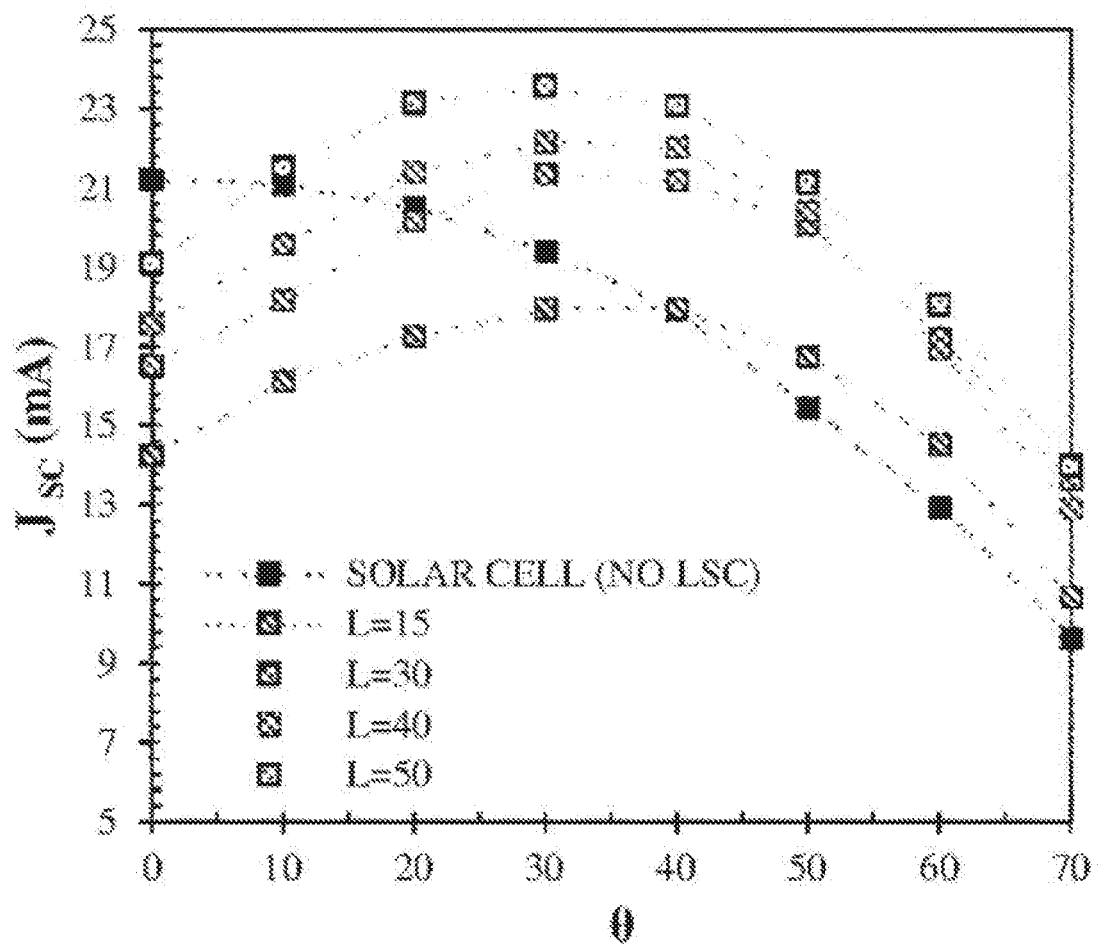
FIG. 3 is a graph showing improved short circuit current of a solar power harvesting apparatus according to some embodiments of the present disclosure compared to a lone solar cell.

Referring now to FIG. 3, this graph gives the short circuit current ($J_{sc}$) as a function of light incidence angle for solar harvesting apparatus according to some embodiments of the present disclosure compared to a solar cell alone. The angle of incidence is measured from the surface normal of the apparatus in the clockwise direction. The solar harvesting apparatus was capable of producing greater $J_{sc}$ for a portion of all incidence angles investigated. This means there is enhancement in the flux of photons absorbed by the photovoltaic end wall of the apparatus at least as a result of the translucent body layer, film, and/or the frame compared to a solar cell without such components. The height is held constant at 7.2 mm and the lengths are given in millimeters.

Thus the apparatus may be installed in areas where previous designs would have been considered too ineffective or inefficient, making the apparatus advantageous for use in the construction of a solar harvesting envelope for a building. For example, instead of installing shingles, siding, and then installing traditional solar panels over them, the apparatus of the present disclosure enables installation of all three at the same time. The apparatus is also effective for use in walkways, railings, doors, awnings, window shutters, mini-blinds, or any other surface exposed to light. Finally, the modular construction of the apparatus substantially eliminates the impact of shading losses, again making the apparatus highly advantageous for use in as a solar harvesting envelope for a building.

Although the disclosed subject matter has been described and illustrated with respect to embodiments thereof, it should be understood by those skilled in the art that features of the disclosed embodiments can be combined, rearranged, etc., to produce additional embodiments within the scope of the invention, and that various other changes, omissions, and additions may be made therein and thereto, without parting from the spirit and scope of the present invention.

What is claimed is:

1. A solar power harvesting apparatus comprising:
   an end wall composed of a photovoltaic material, said end wall including a bottom and a top and having a wall height (H) defined between said bottom and said top;
   a reflective base layer having a first end and a second end, said reflective base layer being positioned at an angle to said photovoltaic material end wall with said first end adjacent to said bottom of said end wall;
   a translucent body layer positioned on said reflective base layer;
   a first gap between said photovoltaic material end wall and said translucent body layer;
   a first film comprising luminescent species embedded in said translucent body layer, said film positioned at a height above said reflective base layer;
   a second film being reflective positioned between said translucent body layer and said reflective base layer; and
   a second gap between said translucent body layer and said second reflective film;
   wherein said first film receives light incident on said translucent body layer.

2. The apparatus of claim 1, wherein said translucent body layer has a first body layer end having a first end height at said photovoltaic material end wall, and a second body layer end having a second end height opposing said first end, wherein said second end height is smaller than said first end height.

3. The apparatus of claim 2, wherein said translucent body layer has a length, wherein an aspect ratio of said length to said first end height is greater than about 1.

4. The apparatus of claim 3, wherein said aspect ratio of said length to said first end height is greater than about 4.

5. The apparatus of claim 4, wherein said first film is positioned at a height above said reflective base layer less than H/2.

6. The apparatus of claim 1, wherein said first film has a luminescent species concentration of about 25 mg/ml to about 30 mg/ml.

7. The apparatus of claim 1, wherein said first film is composed substantially of fluorescent dye, quantum dots, phosphor, or a combination thereof.

8. The apparatus of claim 1, wherein the apparatus is configured to be wired together to a plurality of solar power harvesting apparatus.

9. The apparatus of claim 1, further comprising a frame including a reflective side wall, and a reflective end wall opposing said photovoltaic material end wall.

10. The apparatus of claim 9, wherein said frame is composed of metal, plastic, foam, wood, ceramic, or a combination thereof.

11. The apparatus of claim 1, wherein said translucent body layer is composed substantially of silicone, vinyl, other translucent plastics, glass, or a combination thereof.

12. The apparatus of claim 1, wherein said photovoltaic material end wall is composed of polycrystalline silicon, monocrystalline silicon, GaAs, CdTe, CIGS, perovskite, or a combination thereof.

* * * * *